United States Patent
Huang et al.

(10) Patent No.: US 10,725,334 B2
(45) Date of Patent: Jul. 28, 2020

(54) DISPLAY DEVICE AND MANUFACTURING METHOD THEREOF

(71) Applicant: InnoLux Corporation, Miao-Li County (TW)

(72) Inventors: Shih-Chang Huang, Miao-Li County (TW); Jeng-Wei Yeh, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 66 days.

(21) Appl. No.: 15/954,610

(22) Filed: Apr. 17, 2018

(65) Prior Publication Data

US 2019/0317362 A1 Oct. 17, 2019

(51) Int. Cl.
*G02F 1/133* (2006.01)
*G02F 1/1335* (2006.01)
*G02F 1/13357* (2006.01)
*G02F 1/1343* (2006.01)
*H01L 27/32* (2006.01)

(52) U.S. Cl.
CPC .. *G02F 1/133514* (2013.01); *G02F 1/133603* (2013.01); *G02F 1/134309* (2013.01); *H01L 27/322* (2013.01); *G02F 2001/134345* (2013.01)

(58) Field of Classification Search
CPC ......... G02F 1/133514; G02F 1/133603; G02F 1/134309; G02F 2001/134345; H01L 27/322
See application file for complete search history.

(56) References Cited

U.S. PATENT DOCUMENTS

| | | | | |
|---|---|---|---|---|
| 9,474,119 | B1* | 10/2016 | Chen | G09G 3/3413 |
| 10,128,415 | B2* | 11/2018 | Huang | H01L 33/50 |
| 2002/0008815 | A1* | 1/2002 | Hanakawa | G02F 1/133553 349/113 |
| 2012/0292652 | A1* | 11/2012 | Yamae | H01L 51/524 257/98 |
| 2015/0301407 | A1 | 10/2015 | Chan | |
| 2015/0327342 | A1 | 11/2015 | Lu | |
| 2016/0372637 | A1 | 12/2016 | Huang | |
| 2017/0119490 | A1 | 5/2017 | Mordaunt | |
| 2017/0288097 | A1 | 10/2017 | Li | |
| 2019/0196071 | A1* | 6/2019 | Barrett | G02F 1/1335 |

* cited by examiner

Primary Examiner — Afroza Chowdhury
(74) Attorney, Agent, or Firm — Winston Hsu

(57) ABSTRACT

A display device is provided to have an emission spectrum. The emission spectrum is performed in a white image of highest grey level and includes a first sub emission spectrum ranging from 380 nm to 478 nm and a second sub emission spectrum ranging from 479 nm to 780 nm, and the first sub emission spectrum has a maximum peak wavelength greater than or equal to 453 nm. An integral value of the first sub emission spectrum multiplied by a blue light hazard weighting function from 380 nm to 478 nm is defined as a first integration, and an integral value of the second sub emission spectrum multiplied by an eye function from 479 nm to 780 nm is defined as a second integration. A ratio of the first integration to the second integration is in a range from 40% to 65%.

20 Claims, 13 Drawing Sheets

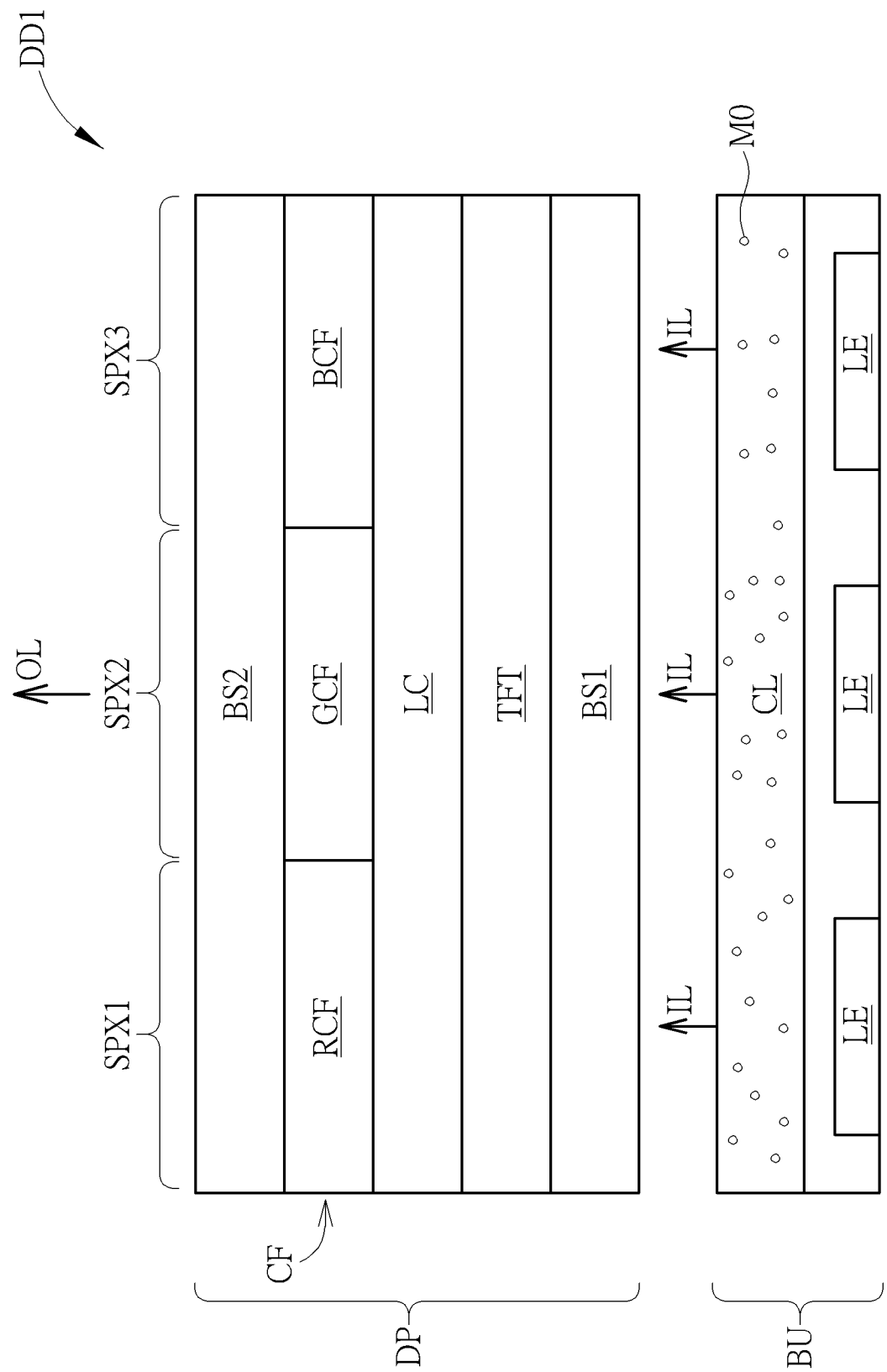

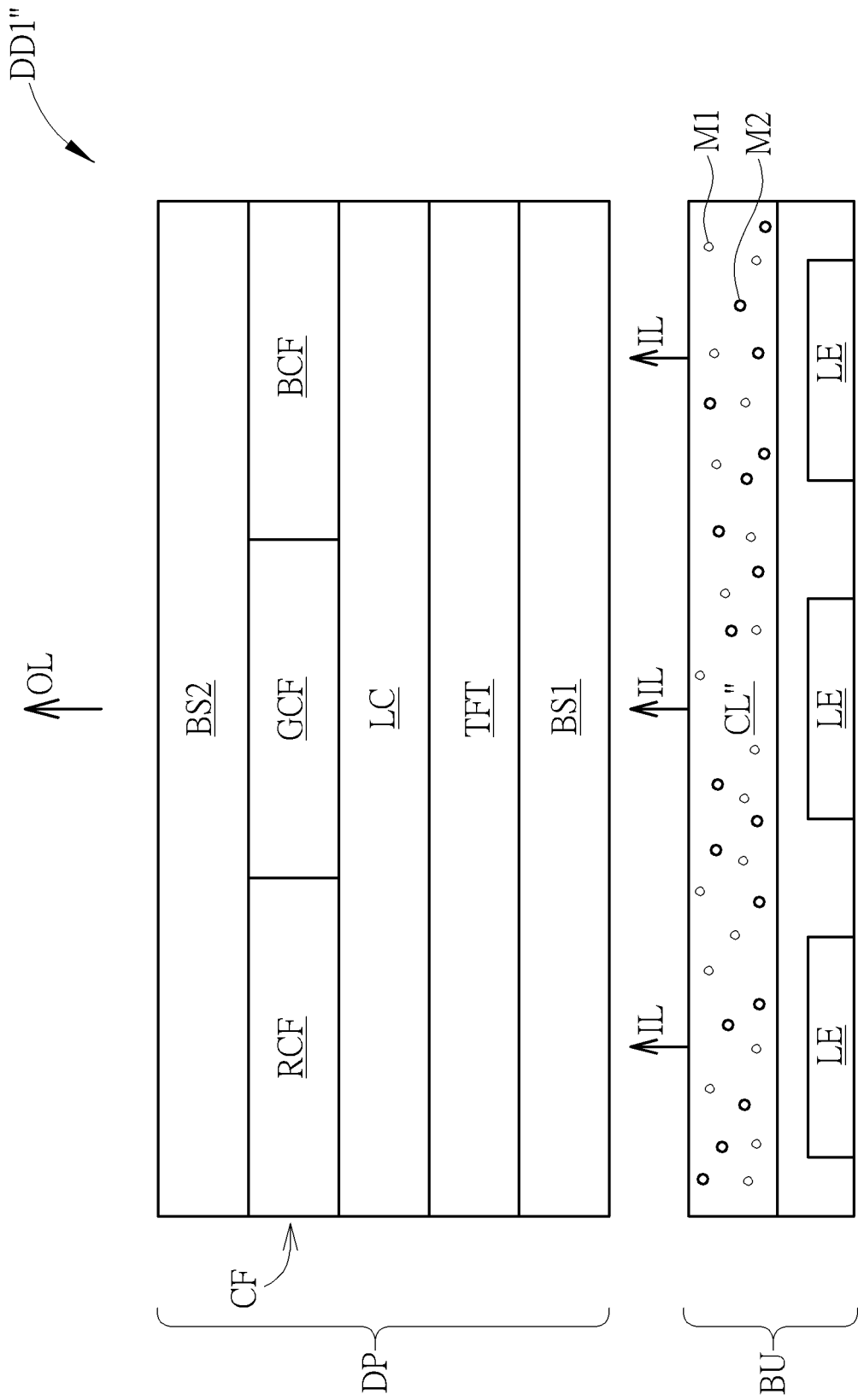

DISPLAY DEVICE AND MANUFACTURING METHOD THEREOF

BACKGROUND OF THE DISCLOSURE

1. Field of the Disclosure

The present disclosure relates to a display device and a manufacturing method thereof, and more particularly, to a display device for protecting a user's eyes from blue light hazards and a manufacturing method thereof.

2. Description of the Prior Art

While display devices are being widely used in various kinds of digital products, the time people spend looking at screens has become longer. Therefore, it's an important research topic to reduce the blue light hazard to a user's eyes, especially for the person who has to look at screens continuously and often, such as doctor or radiographer needs to look at radiographic images on the screens. A conventional method for blocking the blue light is to attach a blue light blocking filter on the display device to restrain the intensity of the blue light. Or, another conventional method for blocking the blue light is to adjust the intensity of blue light generated from the display device by software embedded therein. Although these methods can protect the user's eyes, they may reduce the entire brightness of the display device, or the displayed images become yellowish, which reduces the display quality of the display device.

SUMMARY OF THE DISCLOSURE

According to an embodiment, a display device is provided by the present disclosure. The display device has an emission spectrum which is performed in a white image of highest grey level. The emission spectrum includes a first sub emission spectrum ranging from 380 nm to 478 nm and a second sub emission spectrum ranging from 479 nm to 780 nm, and the first sub emission spectrum having a maximum peak wavelength greater than or equal to 453 nm. An integral value of the first sub emission spectrum multiplied by a blue light hazard weighting function from 380 nm to 478 nm is defined as a first integration, and an integral value of the second sub emission spectrum multiplied by an eye function from 479 nm to 780 nm is defined as a second integration. A ratio of the first integration to the second integration is in a range from 40% to 65%.

According to another embodiment, a manufacturing method of a display device is provided by the present disclosure. First, a backlight unit is provided. After that, a display panel is provided on the backlight unit. The display panel includes a color filter layer, and the display device has an emission spectrum which is performed in a white image of highest grey level. The emission spectrum includes a first sub emission spectrum ranging from 380 nm to 478 nm and a second sub emission spectrum ranging from 479 nm to 780 nm, and the first sub emission spectrum having a maximum peak wavelength greater than or equal to 453 nm. An integral value of the first sub emission spectrum multiplied by a blue light hazard weighting function from 380 nm to 478 nm is defined as a first integration, and an integral value of the second sub emission spectrum multiplied by an eye function from 479 nm to 780 nm is defined as a second integration. A ratio of the first integration to the second integration is in a range from 40% to 65%.

According to another embodiment, a manufacturing method of a display device is provided by the present disclosure. First, a base is provided, and then, a plurality of light emitting elements are formed on the base. The display device has an emission spectrum which is performed in a white image of highest grey level. The emission spectrum includes a first sub emission spectrum ranging from 380 nm to 478 nm and a second sub emission spectrum ranging from 479 nm to 780 nm, and the first sub emission spectrum having a maximum peak wavelength greater than or equal to 453 nm. An integral value of the first sub emission spectrum multiplied by a blue light hazard weighting function from 380 nm to 478 nm is defined as a first integration, and an integral value of the second sub emission spectrum multiplied by an eye function from 479 nm to 780 nm is defined as a second integration. A ratio of the first integration to the second integration is in a range from 40% to 65%.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 4A schematically illustrates a cross-sectional view of the display device according to the first embodiment of the present disclosure.

FIG. 6 schematically illustrates a cross-sectional view of a display device according to a variant embodiment of the first embodiment of the present disclosure.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device and angles shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It will be understood that when an element or layer is referred to as being "disposed on" or "connected to" another element or layer, it can be directly dispose on or directly connected to the other element or layer, or intervening elements or layers may be present. In contrast, when an element is referred to as being "directly disposed on" or "directly connected to" another element or layer, there are no intervening elements or layers exist.

In the disclosure, different technical features in different embodiments described in the following description can be combined, replaced, or mixed with one another to constitute another embodiment without departing from the spirit of the present disclosure.

In the present disclosure, the display device has an emission spectrum that is performed in a white image of highest grey level, which means the color of the emission spectrum is white. Specifically, the emission spectrum of the present disclosure is a spectrum of an output light emitted from the display device, and the output light is defined as a final optical result from the display device to the eyes of the observer (user) in all embodiments, so that the measurement of the emission spectrum is performed on the output light out of the display device. Also, the white image is produced by the display device in an operation of a highest grey level. For example, for 8-bit grayscale color, the highest grey level may be 255, but not limited thereto. Or, the operation at the highest gray level may be performed by driving the corresponding circuit of the display device with a corresponding driving voltage.

Figure 1:
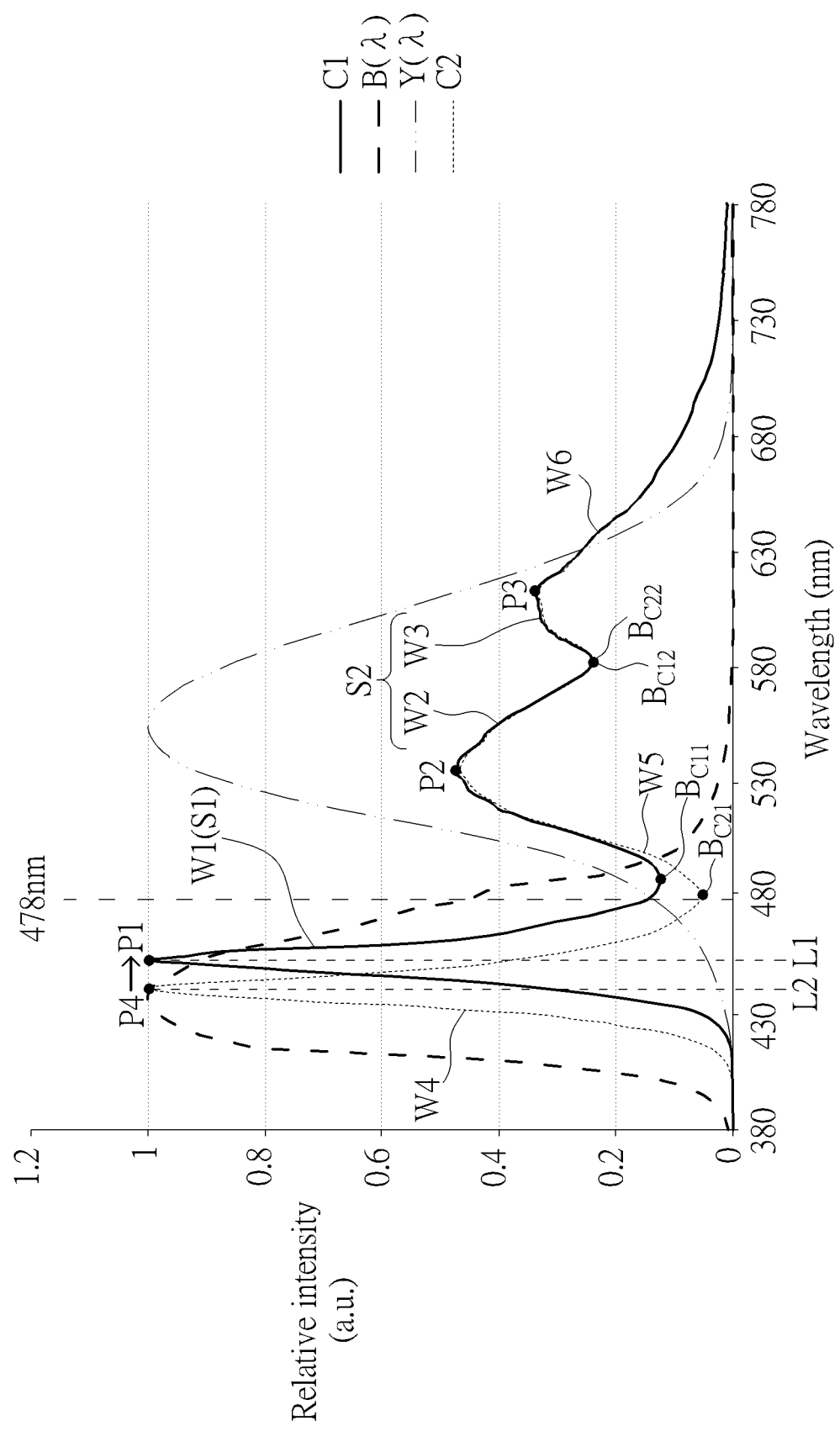
FIG. 1 is a schematic diagram illustrating emission spectrums generated from display devices respectively according to an embodiment of the present disclosure and a comparative embodiment, a blue light hazard weighting function and a photopic luminosity function.

FIG. 1 is a schematic diagram illustrating emission spectrums generated from display devices respectively according to an embodiment of the present disclosure and a comparative embodiment, a blue light hazard weighting function and a photopic luminosity function. As shown in FIG. 1, the emission spectrum C1 of the present embodiment includes a first sub emission spectrum S1 ranging from 380 nm to 478 nm and a second sub emission spectrum S2 ranging from 479 nm to 780 nm. The first sub emission spectrum S1 has a maximum peak wavelength L1 that is greater than or equal to 453 nm. For example, the first sub emission spectrum S1 may have a first wave section W1 for forming blue light, and the first wave section W1 of the first sub emission spectrum S1 has a maximum peak P1 at the maximum peak wavelength L1 that has a maximum intensity. The first sub emission spectrum S1 of the present disclosure is not limited to have one wave section. In one embodiment, the maximum peak wavelength L1 of the first sub emission spectrum S1 may be less than or equal to 478 nm.

Furthermore, the second sub spectrum S2 may for example have a second wave section W2 and a third wave section W3 which are respectively for forming green light and red light, in which the second wave section W2 may has a peak P2 at a wavelength ranging from 480 nm to 580 nm, and the third wave section W3 may has a peak P3 at a wavelength ranging from 580 nm to 780 nm. The second sub spectrum S2 of the present disclosure is not limited thereto. It should be noted that the color of the emission spectrum C1 is white, and the white image shown by the display device can have a white point located within a required white region of CIE 1931 xy chromaticity diagram. In one embodiment, an x value of the white point in the CIE 1931 xy chromaticity diagram is in a range from 0.29 to 0.34, and a y value of the white point in the CIE 1931 xy chromaticity diagram is in a range from 0.305 to 0.355, so that the display device can display the white image with normal white point when being operated at the highest grey level.

Figure 2:
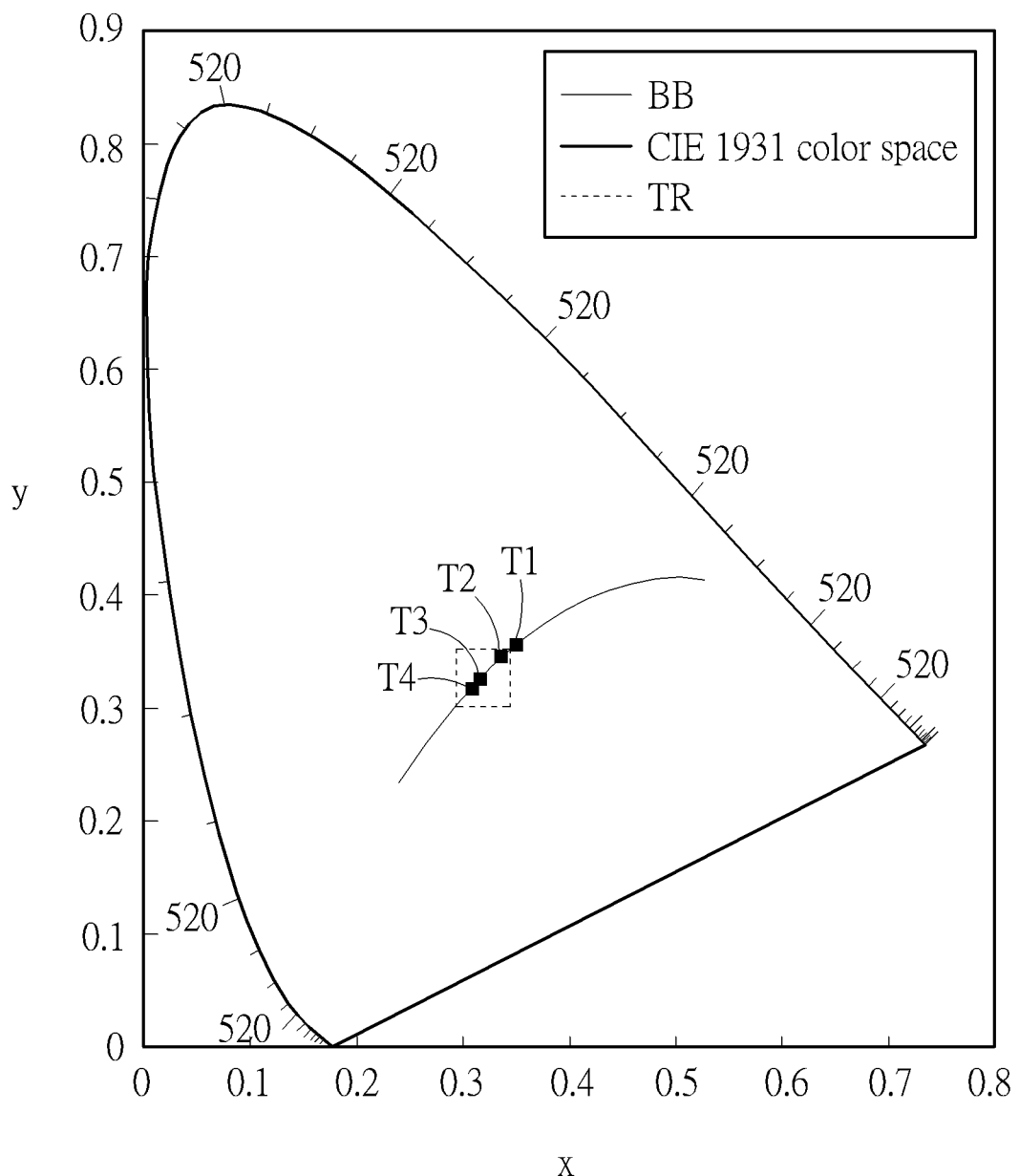
FIG. 2 is a CIE 1931 xy chromaticity diagram illustrating white points and a region where the white points of the present disclosure are located in and a black body curve in the CIE 1931 color space.

Specifically, refer to FIG. 2, which is a CIE 1931 xy chromaticity diagram illustrating white points, a region of the white points and a black body curve in the CIE 1931 color space. The region TR is where the normal white points of the present disclosure can be located within. The region TR can be defined and formed by x values of 0.29 and 0.34 and y values of 0.305 and 0.355. Accordingly, the emission spectrum C1 of this embodiment may be designed to have any one of the white points within the region TR. For example, as shown in FIG. 2, the white points T1, T2, T3 and T4 disposed on the black body curve BB may respectively correspond to color temperatures of 5000K, 5500K, 6500 K, and 7000K. Since the white points T2, T3 and T4 are disposed within the region TR, and the white point T1 is disposed outside the region TR, the emission spectrum C1 may be designed to have any one of the white points T2, T3 and T4, so as to have any one of color temperatures of 5500K, 6500K and 7000K. In other words, the color temperature of the white point formed by the emission spectrum C1 of the present disclosure may range from 5500K to 7000K, but not limited thereto.

In addition, when the intensity of the blue light is adjusted to be too low, the image shown by the display device is easily yellowish. On the contrary, when the intensity of the blue light is adjusted to be too high, user's eyes are easily injured. For this reason, the present disclosure provides an evaluating method to balance the dilemma. The evaluating method is to provide a first ratio. Refer back to FIG. 1. Specifically, an integral value of the first sub emission spectrum S1 multiplied by a blue light hazard weighting function B($\lambda$) from 380 nm to 478 nm is defined as a first integration, which means the first integration is calculated by integrating an integral of an inner product of the first sub emission spectrum S1 and the blue light hazard weighting function B($\lambda$) from 380 nm to 478 nm. The blue light hazard weighting function B($\lambda$) is as shown in FIG. 1. An integral value of the second sub emission spectrum S2 multiplied by an eye function from 479 nm to 780 nm is defined as a second integration, which means the second integration is calculated by integrating an integral of an inner product of the second sub emission spectrum S2 and the eye function from 479 nm to 780 nm. The eye function is for example the photopic luminosity function Y(λ), which describes the spectral sensitivity of human visual perception of brightness under brightly lighting condition, as shown in FIG. 1. The first ratio is defined as a ratio of the first integration to the second integration. An equation representing the calculation of the first ratio is shown as below.

$$K = \frac{\int_{380}^{478} \Phi(\lambda)B(\lambda)d\lambda}{\int_{479}^{780} \Phi(\lambda)Y(\lambda)d\lambda}$$

In the above equation, K is the first ratio, $\Delta$ is a wavelength, $\phi(\lambda)$ is the emission spectrum which is a function of the wavelength, B(λ) is the blue light hazard weighting function which is also a function of the wavelength, and Y($\Delta$) is the photopic luminosity function which is also a function of the wavelength. It is noted that the first ratio is calculated when the emission spectrum C1, the blue light hazard weighting function B(λ) and the photopic luminosity function Y(λ) are normalized respectively. That is to say, the maximum intensity of the emission spectrum C1 is divided by itself and normalized to be 1, the maximum intensity of the blue light hazard weighting function B(λ) is divided by itself and normalized to be 1, and the maximum intensity of the photopic luminosity function Y(λ) is divided by itself and normalized to be 1. In the present disclosure, the first ratio of the first integration to the second integration is in a range from 40% to 65%, so that the blue light hazard to the user's eyes can be as low as possible when the yellowish image shown by operating the display device at the highest grey level is reduced. Accordingly, the reduction of the blue light hazard and enhancement of the display quality can be both achieved.

Specifically, since the first integration is calculated by integrating an integral of an inner product of the first sub emission spectrum S1 and the blue light hazard weighting function B(λ) from 380 nm to 478 nm, the first integration may represent the degree of the blue light hazard to the user's eyes. The second integration is calculated by integrating an integral of an inner product of the second sub emission spectrum S2 and the eye function from 479 nm to 780 nm, so the second integration may represent the degree of the intensity of the yellow light that the user's eyes see. Through designing the first ratio to be in the range from 40% to 65%, the degree of the blue light hazard and the degree of the yellow light can be balanced, so the display device not only can display the white image with normal white point when being operated at the highest grey level, but also reduce the intensity of blue light hazard. For example, when a user, ex. a doctor or radiographer, is looking at radiographic images (such as X-ray images or MRI images) shown by the display device, the displayed radiographic image would not have color shift (yellowish) that affects the judgment on suspected case, and also the blue light hazard to the eyes of the doctor or radiographer can be reduced while looking at the radiographic images for a long time. Or, in another situation, when the user is looking at a webpage on the display device, since most regions in the webpage is set to be white, and the display device of the present disclosure can display the white image with normal white point, the user won't feel that the webpage is too yellowish while looking at the webpage.

In some embodiments, the emission spectrum C1 may optionally comply with another standard for evaluating the blue light hazard, which is the low blue light testing standard of TUV. The standard provides a second ratio that is defined as a ratio of an integral value of the emission spectrum from 415 nm to 455 nm to an integral value of the emission spectrum from 400 nm to 500 nm and is defined to be less than 50%. The emission spectrum C1 also meets the standard of the second ratio, so as to further reduce the blue light hazard while light with the wavelength from 415 nm to 455 nm have more harm to the user's eyes.

As compared with the emission spectrum C1, the emission spectrum C2 of the comparative embodiment has a maximum peak P4 with a maximum peak wavelength L2 that is less than 453 nm, for example equal to 440 nm. Taking the maximum peak wavelength L1 of the emission spectrum C1 being 453 nm and the maximum peak wavelength L2 of the emission spectrum C2 of the comparative embodiment being 440 nm for an example, when the emission spectrum C1 and the emission spectrum C2 have the same color temperature of 5500K, and are produced by a blue LED in combination with yellow phosphor, the first ratio and the second ratio of the emission spectrum C1 may be respectively 43.8% and 49.5%, which comply with the standards of the first ratio and the second ratio, but the first ratio and the second ratio of the emission spectrum C2 may be respectively 50.0% and 76.8%, which don't meet both the standards of the first ratio and the second ratio. Specifically, since the maximum peak wavelength of the blue light hazard weighting function EV, is at 440 nm, the emission spectrum of the comparative embodiment having the maximum peak wavelength of 440 nm would have more harm to the user's eyes. As the above-mentioned, since the maximum peak wavelength L1 of the emission spectrum C1 is designed to be equal to or greater than 453 nm, that is the peak of the emission spectrum C1 from 380 nm to 480 nm is shifted from the maximum peak P4 to the maximum peak P1, the emission spectrum C1 can meet both the standards of the first ratio and the second ratio, thereby reducing the blue light hazard and being capable of providing better display quality. Although the blue light hazard may be reduced through designing the maximum peak wavelength of the emission spectrum to be less than 440 nm, the emission spectrum with the maximum peak wavelength less than 440 nm may further face a problem of UV light hazard.

In some embodiments, the emission spectrum C1 may have a first valley $B_{C11}$ between the first wave section W1 and the second wave section W2. Since the maximum peak wavelength L1 is designed to be greater than the maximum peak wavelength L2, the first valley $B_{C11}$ may have an intensity greater than a corresponding second valley $B_{C21}$ of the emission spectrum C2, but not limited thereto. For example, a ratio of the intensity of the first valley $B_{C11}$ to the intensity of the maximum peak P1 may be less than 0.3 and greater than or equal to 0. In another embodiment, taking a light source of using RGB chips as an example, a ratio of the intensity of the first valley $B_{C11}$ to the intensity of the maximum peak P1 may be less than 0.1 and greater than or equal to 0. Also, the wavelength of the first valley $B_{C11}$ may be greater as the maximum peak wavelength L1 is greater.

In some embodiments, the emission spectrum C2 may have a fourth wave section W4, a fifth wave section W5 and a sixth wave section W6, in which the fourth wave section W4 corresponds to the first wave section W1 of the emission spectrum C1 and has the maximum peak P4, the fifth wave section W5 corresponds to the second wave section W2 of the emission spectrum C1, and the sixth wave section W6 corresponds to the third wave section W3 of the emission spectrum C1. The sixth wave section W6 may be almost the same as the third wave section W3, but the present disclosure is not limited thereto. Furthermore, the emission spectrum C1 may have a third valley $B_{C12}$ between the second wave section W2 and the third wave section W3, and the emission spectrum C2 may have a fourth valley $B_{C22}$, in which the intensity of the third valley $B_{C12}$ may be the same as the intensity of the fourth valley $B_{C22}$, but the present disclosure is not limited thereto. Also, the fifth wave section W5 may have a maximum peak substantially the same as the maximum peak P2 of the wave section W2, but the present disclosure is not limited thereto.

In some embodiments, as the maximum peak wavelength L1 is designed to be equal to or greater than 453 nm, a ratio of an intensity of the peak P2 at the wavelength ranging from 480 nm to 580 nm to the intensity of the maximum peak P1 at the maximum peak wavelength L1 is defined as a third ratio may optionally be in a range from 40% to 70%, so that the emission spectrum C1 still can have the white point in the region TR. The third ratio may be different based on different light emitting elements and will be detailed in the following embodiments.

Figure 3:
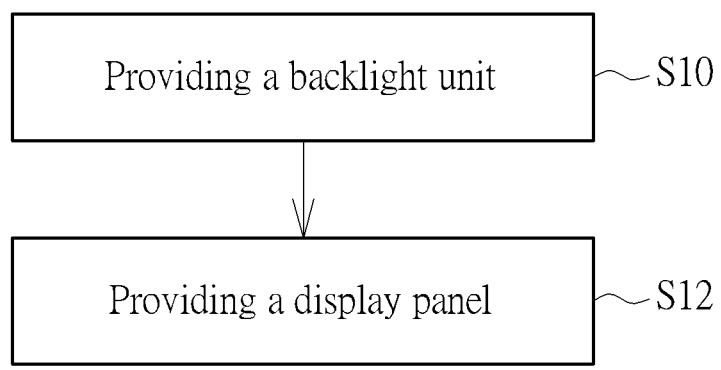
FIG. 3 schematically illustrates a flow chart of a manufacturing method of a display device according to a first embodiment of the present disclosure.

The following description may further detail a manufacturing method of the display device to clearly show the method for adjusting or forming the emission spectrum to meet the standards of the first ratio and the second ratio. Refer to FIG. 3 and FIG. 4A. FIG. 3 schematically illustrates a flow chart of a manufacturing method of a display device according to a first embodiment of the present disclosure, and FIG. 4A schematically illustrates a cross-sectional view of the display device according to the first embodiment of the present disclosure. The manufacturing method of the display device of the first embodiment may include the following steps. In this embodiment, the display device DD1 is a non-self-luminous display device, for example a liquid crystal display device, but the disclosure is not limited thereto. Step S10 is first performed to provide a backlight unit BU. The backlight unit BU includes at least one light emitting element LE for generating a blue light. In this embodiment, the backlight unit BU may include a plurality of light emitting elements LE and a light converting layer CL disposed on the light emitting elements LE. The light converting layer CL of this embodiment may cover the light emitting elements LE for converting the blue light from the light emitting elements LE into a yellow light, so that the blue light penetrating through the light converting layer CL and the yellow light may be mixed into an input light IL emitted from the backlight unit BU, but the present disclosure is not limited thereto. In one embodiment, the light converting layer CL may include a light converting material M0 for converting the blue light into a yellow light, so the blue light and the yellow light may be mixed into the input light IL, and the input light may be a white light. The x value and y value of the white point of the input light IL in the CIE 1931 xy chromaticity diagram may be different from or the same as the x value and y value of the white point of the output light OL measured from the display device DD1. The x value of the input light IL may be less than the x value of the output light OL, and a difference between the x value of the input light IL and the x value of the output light OL may be less than or equal to 0.020. In another embodiment, the difference between the x value of the input light IL and the x value of the output light OL may be less than or equal to 0.010. The y value of the input light IL may be less than the y value of the output light OL, and a difference between the y value of the input light IL and the y value of the output light OL may be less than or equal to 0.020.

For example, the light converting material M0 may include a quantum dot material, a phosphor material, a color filter material or a pigment material, but not limited thereto. In another embodiment, the light converting layer CL may directly cover and contact the light emitting elements. In another embodiment, the light converting layer CL may be included in each light emitting element LE. In another embodiment, the backlight unit BU may not include the light converting layer CL.

After step S10, step S12 is performed to provide a display panel DP on the backlight unit BU to form the display device DD1 of this embodiment. The display panel DP includes a color filter layer CF for converting the input light IL into an output light OL with the above-mentioned emission spectrum C1 that complies with the standard of the first ratio. In this embodiment, the emission spectrum C1 may further comply with the standard of the second ratio, but not limited thereto. Also, the display panel DP may further include a bottom base BS1, a top base BS2, a liquid crystal layer LC, and a circuit layer TFT, in which the liquid crystal layer LC is disposed between the bottom base BS1 and the top base BS2, the circuit layer TFT is disposed between the bottom base BS1 and the liquid crystal layer LC, and the color filter layer CF is disposed between the liquid crystal layer LC and the top base BS2. The bottom base BS1 and the top base BS2 may be a hard substrate or a flexible substrate. For example, when the display device DD1 is the liquid crystal display device, a material of the bottom base BS1 and a material of the top base BS2 may comprise glass, plastic, quartz, sapphire, polyimide (PI), polyethylene terephthalate (PET) or other suitable material, but the present disclosure is not limited herein. For example, the color filter layer CF may include a red color filter RCF corresponding to a red sub-pixel SPX1, a green color filter GCF corresponding to a green sub-pixel SPX2 and a blue color filter BCF corresponding to a blue sub-pixel SPX3, in which the red sub-pixel SPX1, the green sub-pixel SPX2 and the blue sub-pixel SPX3 may form a pixel for generating the output light OL with the white color, but the formation of the sub-pixels of the present disclosure is not limited thereto. The person of ordinary skill will understand that the display panel DP may further include other layers, elements or devices, such as polarizers, alignment layers, black matrix, common electrode and optical films, and the circuit layer TFT may include elements, such as pixel electrodes, thin-film transistors, scan lines, data lines and common lines, for driving the display panel, so they will not be further detailed herein. Also, the shift effect to the emission spectrum by the bottom base BS1, the top base BS2, the liquid crystal layer, the circuit layer and those layers, elements or devices may be ignored in the present disclosure. The location of the color filter layer CF of the present disclosure is not limited herein, and may be disposed at any location in the display panel DP. For example, the color filter layer CF may be disposed between the bottom base BS1 and the liquid crystal layer LC. In another embodiment, the light converting layer CL may be disposed in the display panel DP and between the bottom base BS1 and the color filter layer CF.

Figure 4B:
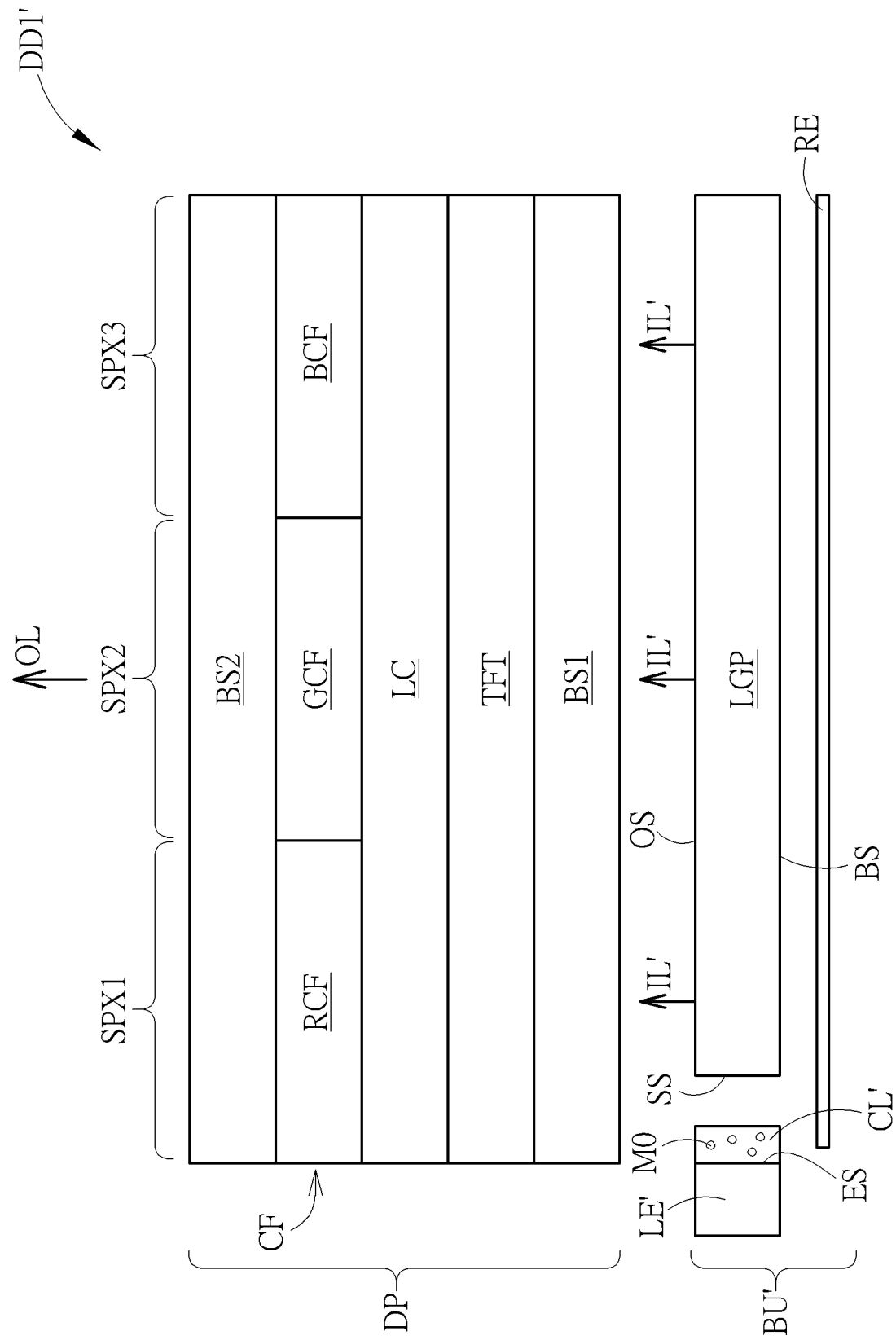
FIG. 4B schematically illustrates a cross-sectional view of a display device according to another variant embodiment of the first embodiment of the present disclosure.

The backlight unit of the present disclosure is not limited to the above-mentioned embodiment. Refer to FIG. 4B, which schematically illustrates a cross-sectional view of the display device according to a first variant embodiment of the present disclosure. As shown in FIG. 4B, a difference between the display device DD1' of the first variant embodiment and the display device DD1 of the first embodiment is that the backlight unit BU' of this variant embodiment is an edge-type backlight unit. Specifically, the backlight unit BU' includes at least one light emitting element LE' and a light guide plate LGP, in which the at least one light emitting element LE' is disposed at at least one side of the light guide plate LGP, and an emitting surface ES of the light emitting element LE' faces a side surface SS of the light guide plate LGP. Accordingly, light generated from the light emitting element LE' can enter the side surface SS and be guided to emit out of an output surface OS of the light guide plate LGP, so as to become the input light IL', in which the output surface OS may be connected to or adjacent to the side surface SS. In this variant embodiment, the backlight unit BU' further includes a light converting layer CL' including the light converting material M0 for converting the blue light into a yellow light. The light converting layer CL' may cover the emitting surface ES of the light emitting element LE'. In some embodiments, the backlight unit BU' may not include the light converting layer CL', and the light converting material M0 may be dispersed in the light guide plate LGP. In some embodiment, the backlight unit BU' may further include a reflector RE for reflect light in the light guide plate LGP toward the output surface OS. The reflector RE may be disposed on a bottom surface BS of the light guide plate LGP opposite to the output surface OS.

Figure 5A:
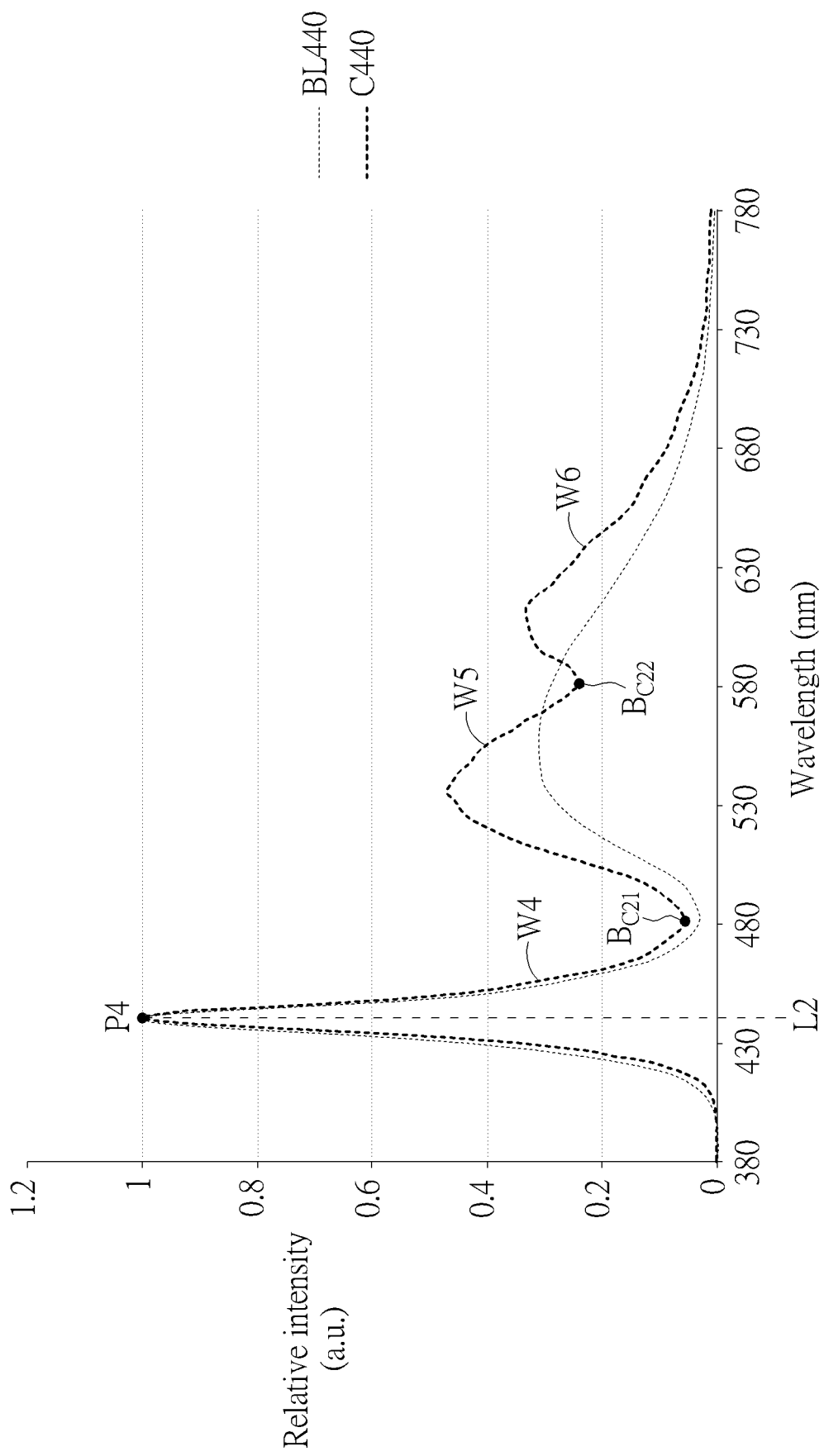
FIG. 5A is a schematic diagram illustrating the emission spectrum of the output light and emission spectrums of the input light according to a comparative embodiment.
Figure 5B:
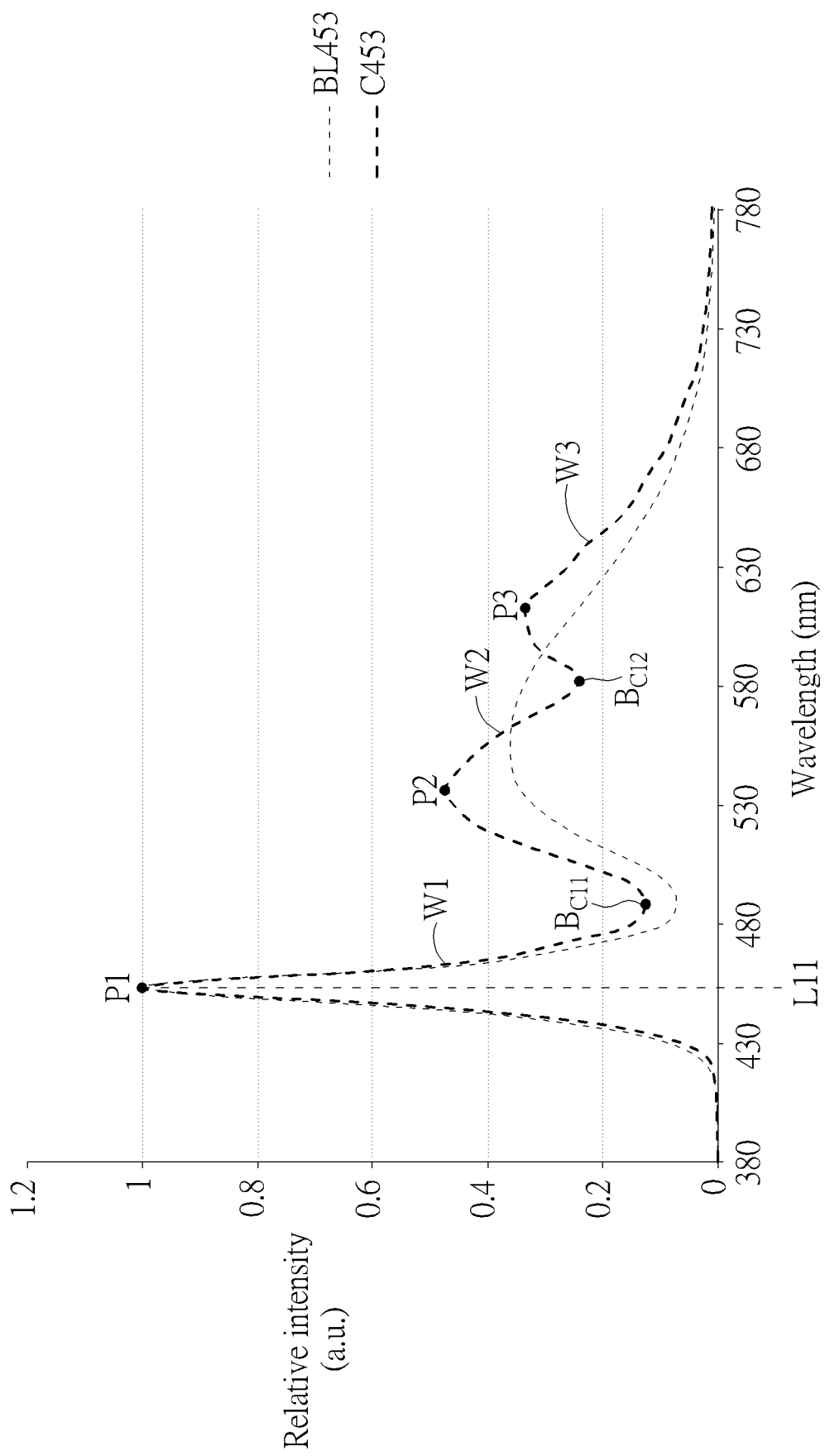
FIG. 5B is a schematic diagram illustrating an emission spectrum of the output light and an emission spectrum of the input light according to a first example of the first embodiment of the present disclosure.
Figure 5C:
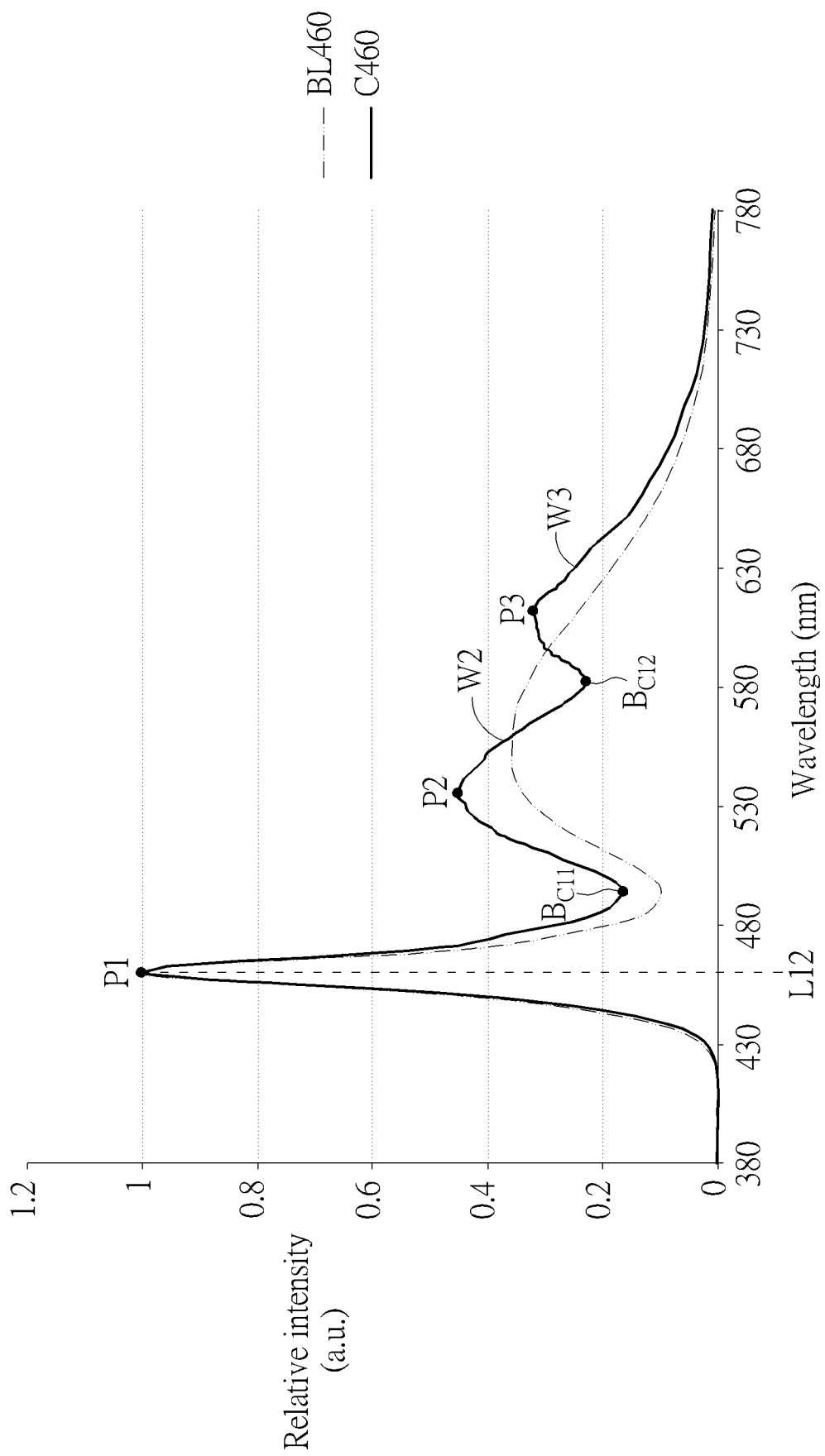
FIG. 5C is a schematic diagram illustrating an emission spectrum of the output light and an emission spectrum of the input light according to a second example of the first embodiment of the present disclosure.

The following description further compares the emission spectrums with different maximum peak wavelengths generated by the display device of the first embodiment with the emission spectrum of the comparative embodiment applying the structure of the display device of the first embodiment, in which the difference between the emission spectrums of the first embodiment and the emission spectrum of the comparative embodiment is that the emission spectrum of the output light in the comparative embodiment has the maximum peak wavelength less than 453 nm. Referring to FIG. 5 A, FIG. 5B and FIG. 5C, FIG. 5A is a schematic diagram illustrating the emission spectrum of the output light and emission spectrums of the input light according to a comparative embodiment, FIG. 5B is a schematic diagram illustrating an emission spectrum of the output light and an emission spectrum of the input light according to a first example of the first embodiment of the present disclosure, and FIG. 5C is a schematic diagram illustrating an emission spectrum of the output light and an emission spectrum of the input light according to a second example of the first embodiment of the present disclosure. As shown in FIG. 5A, the emission spectrum BL440 represents the emission spectrum of the input light generated from the backlight unit according to the comparative embodiment, and the emission spectrum C440 represents the emission spectrum of the output light generated from the display device according to the comparative embodiment and is formed from the emission spectrum BL440. The maximum peak wavelength of the emission spectrum BL440 of the input light may be substantially the same as the maximum peak wavelength L2 of the emission spectrum C440 of the output light, for instance about 440 nm. The difference between the maximum peak wavelength of the input light and the maximum peak wavelength of the corresponding output light may be less than or equal to 2 nm. As shown in FIG. 5B, in the first example of the first embodiment, the emission spectrum BL453 represents the emission spectrum of the input light generated from the backlight unit, and the emission spectrum C453 represents the emission spectrum of the input light generated from the backlight unit and is formed from the emission spectrum BL453. The maximum peak wavelength of the emission spectrum BL453 of the input light may be substantially the same as the maximum peak wavelength L11 of the emission spectrum C453 of the output light, for instance about 453 nm. The difference between the maximum peak wavelength of the input light and the maximum peak wavelength of the corresponding output light may be less than or equal to 2 nm. As shown in FIG. 5C, in the second example of the first embodiment, the emission spectrum BL460 represents the emission spectrum of the input light generated from the backlight unit, and the emission spectrum C460 represents the emission spectrum of the input light generated from the backlight unit and is formed from the emission spectrum BL460. The maximum peak wavelength of the emission spectrum BL460 of the input light may be substantially the same as the maximum peak wavelength L12 of the emission spectrum C460 of the output light and greater than the maximum peak wavelength L11, for instance about 460 nm. Since the difference between the maximum peak wavelength of each input light and the maximum peak wavelength of the corresponding output light may be less than or equal to 2 nm, the maximum peak wavelength of the output light may be adjusted by the maximum peak wavelength of the input light, which means the maximum peak wavelength of the output light may be adjusted by the design of the backlight unit. For example, a difference between the display device of the comparative embodiment and the display device DD1 of the first embodiment may be that the light emitting element of the comparative embodiment and the light emitting element of the first embodiment have different maximum peak wavelengths, but not limited thereto. Also, in the comparative embodiment, the relative intensity of the second valley $B_{C21}$ is less than peak of W4 and peak of W5, as shown in FIG. 5A; in the first example of the first embodiment, the relative intensity of first valley $B_{C11}$ is less than maximum peak P1 and maximum peak P2, as shown in FIG. 5B; and the relative intensity of the first valley $B_{C11}$ of the second example of the first embodiment is greater than the relative intensity of first valley $B_{C11}$ of the first example. In another embodiment, when the maximum peak wavelength of the emission spectrum is greater, the wavelength of the valley between the maximum peak and a peak ranging from 480 to 580 may be greater.

Refer to TABLE 1 and TABLE 2 as well as FIG. 4A, FIG. 5A, FIG. 5B and FIG. 5C. TABLE 1 lists the first ratios calculated according to the comparative embodiment and the first embodiment at different maximum peak wavelengths and at different color temperatures, and TABLE 2 lists the second ratios calculated according to the comparative embodiment and the first embodiment at different maximum peak wavelengths and at different color temperatures. As can be seen in TABLE 1 and TABLE 2, with respect to the emission spectrums of the display device DD1 in the first embodiment, when the color temperature is in a range from 5500K to 7000K and the maximum peak wavelength is in a range from 453 nm to 478 nm, the first ratio of the emission spectrum can be in a range from 40% to 65%. Also, the second ratio of the emission spectrum may be almost less than 50%. Thus, through the light emitting element, emission spectrum of the output light may be adjusted to meet the standard of the first ratio and the second ratio.

TABLE 1

| Color temperature (K) | First ratio of comparative embodiment<br>Maximum peak wavelength of 440 nm | First ratio of first embodiment | | | |
|---|---|---|---|---|---|
| | | Maximum peak wavelength of 453 nm | Maximum peak wavelength of 454 nm | Maximum peak wavelength of 455 nm | Maximum peak wavelength of 460 nm |
| 5000 | 43.2% | 38.4% | 38.0% | 37.7% | 35.4% |
| 5500 | 50.0% | 43.8% | 43.5% | 42.6% | 40.9% |
| 6500 | 60.8% | 53.5% | 53.2% | 52.7% | 49.7% |
| 7000 | 66.8% | 58.0% | 57.6% | 57.1% | 54.8% |
| 7500 | 70.3% | 61.6% | 61.2% | 60.6% | 57.2% |
| 8000 | 73.1% | 65.1% | 64.6% | 64.0% | 60.4% |

TABLE 2

| Color temperature (K) | Second ratio of comparative embodiment<br>Maximum peak wavelength of 440 nm | Second ratio of first embodiment | | | |
|---|---|---|---|---|---|
| | | Maximum peak wavelength of 453 nm | Maximum peak wavelength of 454 nm | Maximum peak wavelength of 455 nm | Maximum peak wavelength of 460 nm |
| 5000 | 76.0% | 49.1% | 45.4% | 41.6% | 23.8% |
| 5500 | 76.8% | 49.5% | 45.8% | 41.9% | 24.0% |
| 6500 | 77.7% | 50.1% | 46.4% | 42.5% | 24.3% |
| 7000 | 78.1% | 50.3% | 46.5% | 42.6% | 24.4% |
| 7500 | 78.3% | 50.5% | 46.7% | 42.8% | 24.4% |
| 8000 | 78.4% | 50.6% | 46.8% | 42.9% | 24.5% |

In some embodiments, refer to TABLE 3 as well as FIG. 4A, FIG. 5A, FIG. 5B and FIG. 5C. TABLE 3 lists the third ratios calculated according to the comparative embodiment and the first embodiment at different maximum peak wavelengths and at different color temperatures. When the color temperature is in a range from 5500K to 7000K and the maximum peak wavelength is in a range from 453 nm to 478 nm, the third ratio of the emission spectrum may optionally be in a range from 40% to 60%. Also, as the color temperature is greater, the third ratio is less.

The structure of the display device is not limited by the aforementioned embodiment, and may have other different variant embodiments or embodiments. To simplify the description, the identical components in each of the following variant embodiments or embodiments are marked with identical symbols. For making it easier to compare the difference between the first embodiment and the variant embodiment and the difference between the first embodiment and other embodiments, the following description will

TABLE 3

| Color temperature (K) | Third ratio of comparative embodiment<br>Maximum peak wavelength of 440 nm | Third ratio of first embodiment | | | |
|---|---|---|---|---|---|
| | | Maximum peak wavelength of 453 nm | Maximum peak wavelength of 454 nm | Maximum peak wavelength of 455 nm | Maximum peak wavelength of 460 nm |
| 5000 | 66.2% | 66.5% | 67.4% | 67.1% | 64.1% |
| 5500 | 57.2% | 58.3% | 58.8% | 59.3% | 55.2% |
| 6500 | 47.0% | 47.6% | 48.0% | 47.7% | 45.3% |
| 7000 | 42.7% | 43.9% | 44.2% | 44.0% | 41.0% |
| 7500 | 40.6% | 41.3% | 41.6% | 41.4% | 39.3% |
| 8000 | 38.5% | 39.1% | 39.4% | 39.2% | 37.1% | detail the dissimilarities among different variant embodiments or embodiments and the identical features will not be redundantly described.

Refer to FIG. 6 schematically illustrates a cross-sectional view of a display device according to a second variant embodiment of the first embodiment of the present disclosure. A difference between the display device DD1" of the second variant embodiment and the display device DD1 of the first embodiment is that the light converting layer CL" may include two light converting materials M1, M2 for respectively converting the blue light into a red light and converting the blue light into a green light in the first variant embodiment, so the blue light generated from the light emitting elements, the red light and the green light may be mixed into the input light IL. The input light IL may be a white light. In this embodiment, the light converting materials M1, M2 may include a quantum dot material, a phosphor material, a color filter material or a pigment material, but not limited thereto. In some embodiments, the light converting materials M1, M2 may also be applied to the light converting layer or the light guide plate of the first variant embodiment.

Refer to TABLE 4 and TABLE 5 as well as FIG. 6. TABLE 4 lists the first ratios calculated according to another comparative embodiment and the second variant embodiment at different maximum peak wavelengths and at different color temperatures, and TABLE 5 lists the second ratios calculated according to the comparative embodiment and the second variant embodiment at different maximum peak wavelengths and at different color temperatures. A difference between the display device of the comparative embodiment and the display device DD1" of the second variant embodiment may be that the light emitting elements of the comparative embodiment and the light emitting elements of the second variant embodiment have different maximum peak wavelengths, but not limited thereto. As can be seen in TABLE 4 and TABLE 5, with respect to the emission spectrums of the display device DD1" in the second variant embodiment of the first embodiment, when the color temperature is in a range from 5500K to 7000K and the maximum peak wavelength is in a range from 453 nm to 478 nm, the first ratio of the emission spectrum can be in a range from 40% to 65%. Also, the second ratio of the emission spectrum may be less than 50%.

TABLE 4

| Color temperature (K) | First ratio of comparative embodiment Maximum peak wavelength of 440 nm | First ratio of first variant embodiment | | | |
|---|---|---|---|---|---|
| | | Maximum peak wavelength of 453 nm | Maximum peak wavelength of 454 nm | Maximum peak wavelength of 455 nm | Maximum peak wavelength of 460 nm |
| 5000 | 45.0% | 40.3% | 40.1% | 39.7% | 38.1% |
| 5500 | 50.4% | 45.3% | 44.9% | 44.6% | 42.6% |
| 6500 | 60.9% | 54.4% | 54.2% | 53.5% | 51.2% |
| 7000 | 65.4% | 58.7% | 58.3% | 57.7% | 55.3% |
| 7500 | 68.7% | 61.8% | 61.4% | 60.9% | 58.1% |
| 8000 | 72.4% | 65.2% | 64.5% | 64.2% | 61.4% |

TABLE 5

| Color temperature (K) | Second ratio of comparative embodiment Maximum peak wavelength of 440 nm | Second ratio of first variant embodiment | | | |
|---|---|---|---|---|---|
| | | Maximum peak wavelength of 453 nm | Maximum peak wavelength of 454 nm | Maximum peak wavelength of 455 nm | Maximum peak wavelength of 460 nm |
| 5000 | 78.9% | 48.4% | 44.4% | 40.2% | 21.2% |
| 5500 | 79.1% | 48.5% | 44.5% | 40.3% | 21.3% |
| 6500 | 79.4% | 48.7% | 44.6% | 40.4% | 21.4% |
| 7000 | 79.5% | 48.7% | 44.7% | 40.5% | 21.4% |
| 7500 | 79.6% | 48.8% | 44.7% | 40.5% | 21.4% |
| 8000 | 79.6% | 48.8% | 44.7% | 40.5% | 21.4% |

In some embodiments, refer to TABLE 6 as well as FIG. 6. TABLE 6 lists the third ratios calculated according to the comparative embodiment and the second variant embodiment at different maximum peak wavelengths and at different color temperatures. When the color temperature is in a range from 5500K to 7000K and the maximum peak wavelength is in a range from 453 nm to 478 nm, the third ratio of the emission spectrum may optionally be in a range from 45% to 70%. Also, as the color temperature is greater, the third ratio is less.

TABLE 6

| | Third ratio of comparative embodiment | Third ratio of first variant embodiment | | | |
|---|---|---|---|---|---|
| Color temperature (K) | Maximum peak wavelength of 440 nm | Maximum peak wavelength of 453 nm | Maximum peak wavelength of 454 nm | Maximum peak wavelength of 455 nm | Maximum peak wavelength of 460 nm |
| 5000 | 75.6% | 73.5% | 74.0% | 73.2% | 66.8% |
| 5500 | 68.9% | 66.5% | 67.5% | 66.2% | 60.7% |
| 6500 | 58.2% | 56.3% | 56.7% | 56.0% | 50.9% |
| 7000 | 54.7% | 52.6% | 53.1% | 52.2% | 47.4% |
| 7500 | 52.4% | 50.2% | 50.7% | 49.8% | 45.3% |
| 8000 | 50.0% | 47.8% | 48.5% | 47.4% | 43.0% |

Figure 7:
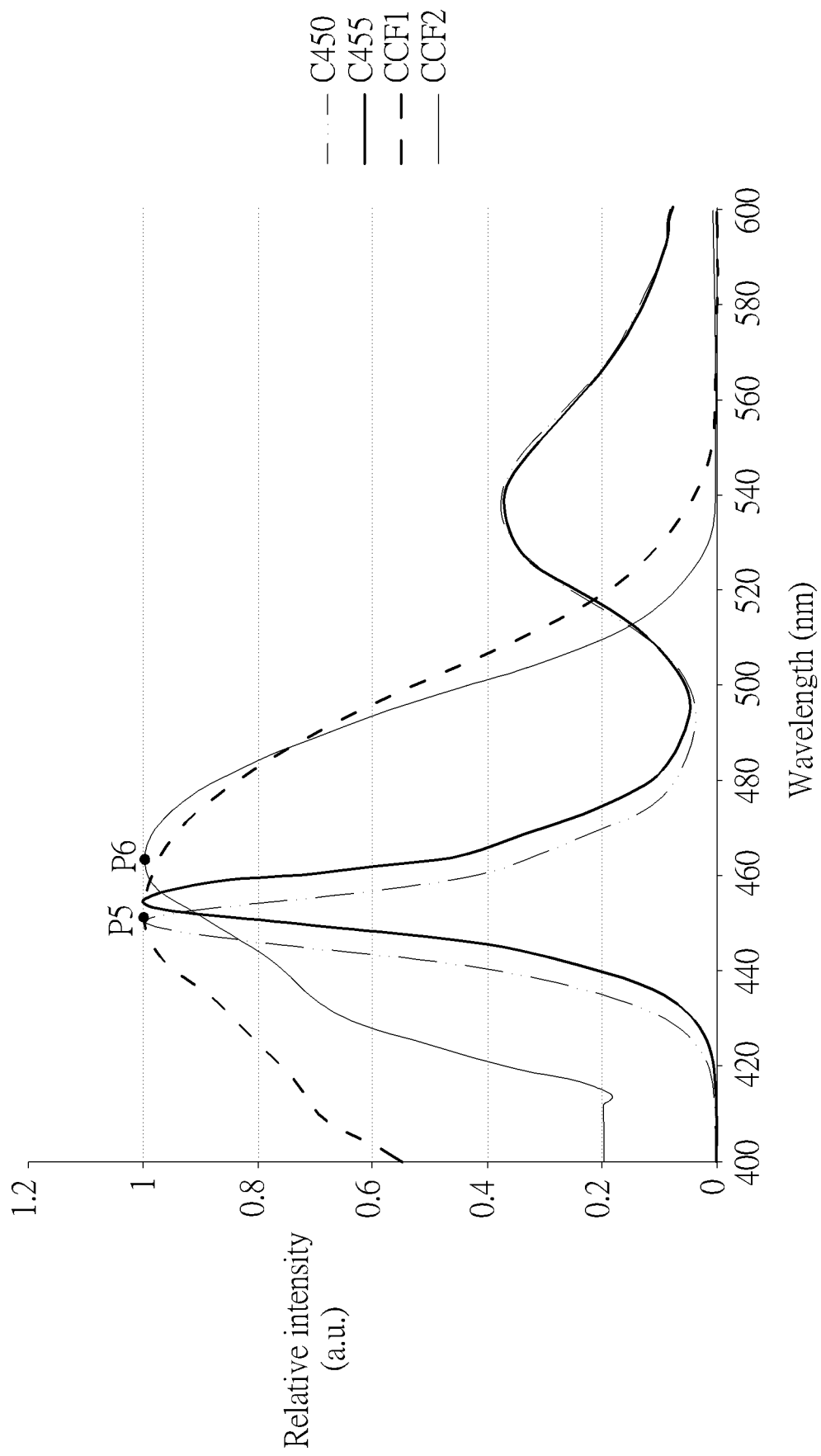
FIG. 7 is a schematic diagram illustrating emission spectrums of the output light and transmission spectrums of the blue color filters according to another variant embodiment of the first embodiment of the present disclosure and another comparative embodiment.

Refer to FIG. 7 as well as FIG. 4A. FIG. 7 is a schematic diagram illustrating emission spectrums of the output light and transmission spectrums of the blue color filters according to a third variant embodiment of the first embodiment of the present disclosure and another comparative embodiment. In the comparative embodiment, the transmission spectrum CCF1 is a transmission spectrum of a blue color filter to allow light penetrating through, and the emission spectrum C450 is a spectrum of the output light formed by an input light penetrating through the blue color filter with the transmission spectrum CCF1. The transmission spectrum CCF1 may have a maximum peak wavelength less than 453 nm, for example the transmission spectrum CCF1 has a maximum peak P5 that is at a wavelength of about 450 nm. That is, the maximum peak P5 is close to that of the maximum peak of the emission spectrum C450, so the emission spectrum C450 that is formed from the light penetrating through the blue color filter with the transmission spectrum CCF1 may for example have the maximum peak wavelength of 450 nm. In the third variant embodiment of the first embodiment, the transmission spectrum CCF2 is a transmission spectrum of the blue color filter BCF, and the emission spectrum C455 is a spectrum of the output light formed by an input light penetrating through the blue color filter with the transmission spectrum CCF2. The transmission spectrum CCF2 may have a maximum peak P6 that is at a wavelength equal to or greater than 453 nm, so the emission spectrum C455 that is formed from the light penetrating through the blue color filter with the transmission spectrum CCF2 may for example have the maximum peak wavelength of 465 nm. Accordingly, through adjusting the transmission spectrum CCF2 of the blue color filter BCF, the maximum peak wavelength of the emission spectrum of the output light may be shifted to be equal to or greater than 453 nm.

Figure 8:
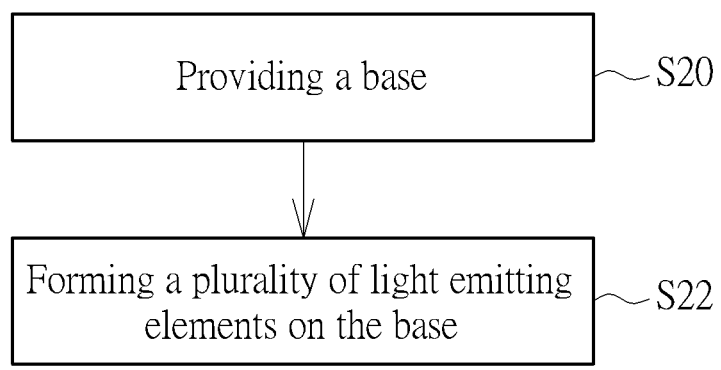
FIG. 8 schematically illustrates a flow chart of a manufacturing method of a display device according to a second embodiment of the present disclosure.
Figure 9:
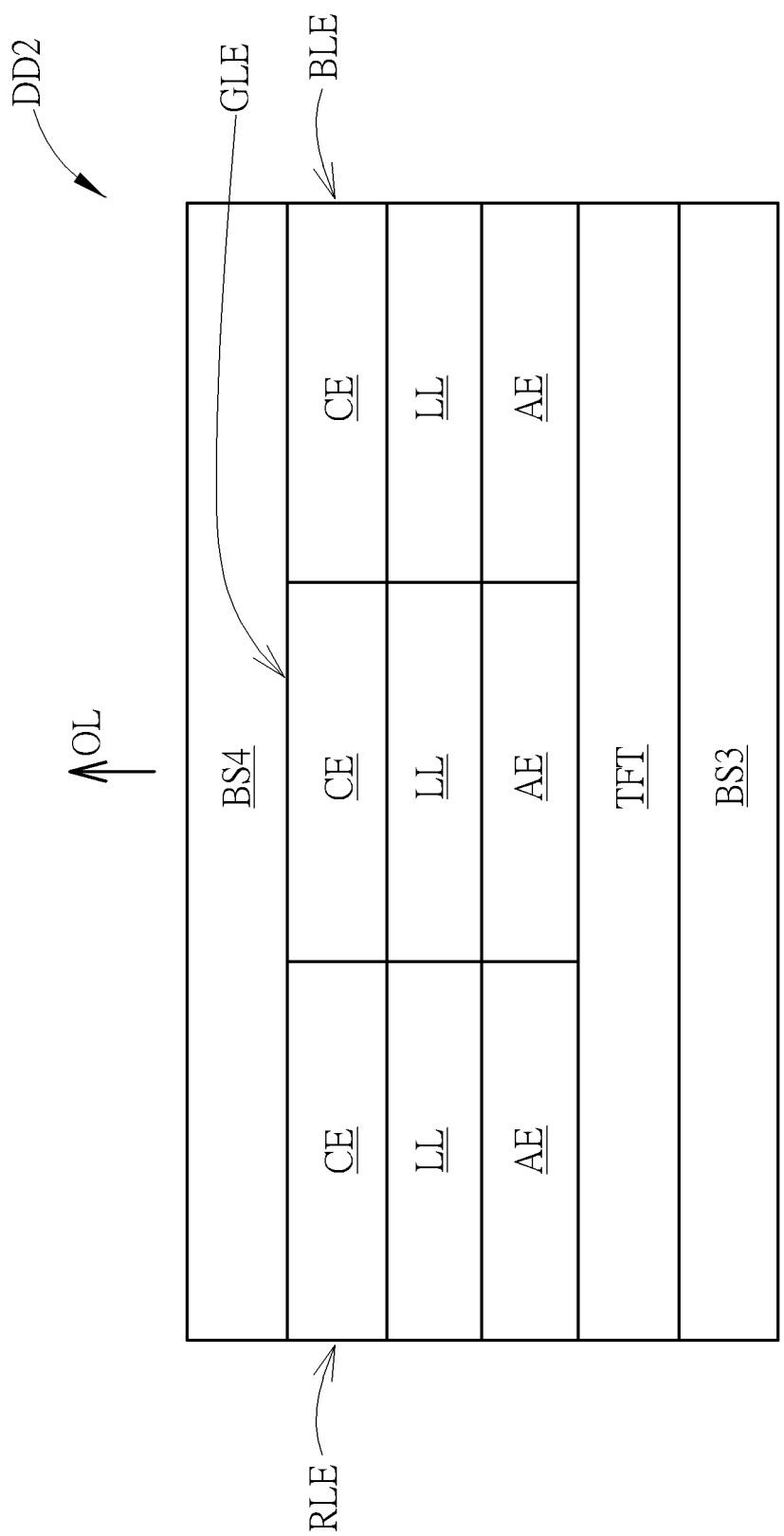
FIG. 9 schematically illustrates a cross-sectional view of the display device according to the second embodiment of the present disclosure.

Refer to FIG. 8 and FIG. 9. FIG. 8 schematically illustrates a flow chart of a manufacturing method of a display device according to a second embodiment of the present disclosure, and FIG. 9 schematically illustrates a cross-sectional view of the display device according to the second embodiment of the present disclosure. The manufacturing method of the display device DD2 of the second embodiment may include the following steps. Step S20 is first performed to provide a base BS3. Thereafter, a plurality of light emitting elements are formed on the base BS3 to form the display device DD2 (Step S22). After forming the light emitting elements, a base BS4 may be further formed to cover the light emitting elements, so as to protect the light emitting elements. The display device DD2 may be a self-luminous display device. The display device DD2 may be an inorganic light emitting diode display device (ex. QLED) or an organic light emitting element (ex. OLED), but not limited thereto. The base BS3 and the base BS4 may be a hard substrate or a flexible substrate. For example, when the display device DD2 is the self-luminous display device, a material of the base BS3 and a material of the base BS4 may comprise at least one of glass, plastic, quartz, sapphire, polyimide (PI), polyethylene terephthalate (PET) or other suitable material, but the present disclosure is not limited herein. The base BS4 may be a protective layer. The protective layer may serve as an encapsulation layer, a barrier film or a barrier layer for protecting the light emitting diodes from moisture and oxygen. The encapsulation layer, the barrier film and the barrier layer may include organic material, inorganic material or a stack of the organic material and the inorganic material (such as a stack of an inorganic layer, an organic layer and an inorganic layer).

The light emitting elements may include a red light emitting element RLE for generating a red light, a green light emitting element GLE for generating a green light and a blue light emitting element BLE for generating a blue light. Each of the light emitting elements may include an anode AE, a light emitting layer LL and a cathode CE staked sequentially on a circuit layer TFT. The red light, the green light and the blue light may form the output light OL with the emission spectrum CL1 of white image, so through adjusting the maximum peak wavelength of the blue organic light emitting element BLE, the emission spectrum of the display device DD2 may meet the standard of the first ratio, in which the emission spectrum CL1 of white image is formed while the red light emitting element RLE, the green light emitting element GLE and the blue light emitting element BLE are driven at a highest grey level. In some embodiments, the emission spectrum of the display device DD2 may further meet the standard of the second ratio, or meet the standards of the second ratio and the third ratio. In this embodiment, the circuit layer TFT may be formed between providing the base BS3 and forming the light emitting elements for driving the light emitting elements, but not limited thereto. In another embodiment, the display device DD2 may further include at least one of the color filter layer and the light converting layer of the first embodiment disposed on the light emitting elements to adjusting its emission spectrum.

In another embodiment, the light emitting elements may generate white light, and the display device may further include color filters on the light emitting elements, such that light generated from the light emitting elements may serve as the input light, and the light from the light emitting elements may penetrate through the color filters to form the output light, which means light emitted out of the color filters may serve as the output light. With this design, the color filters may be used to adjust the emission spectrum of the output light.

Figure 10:
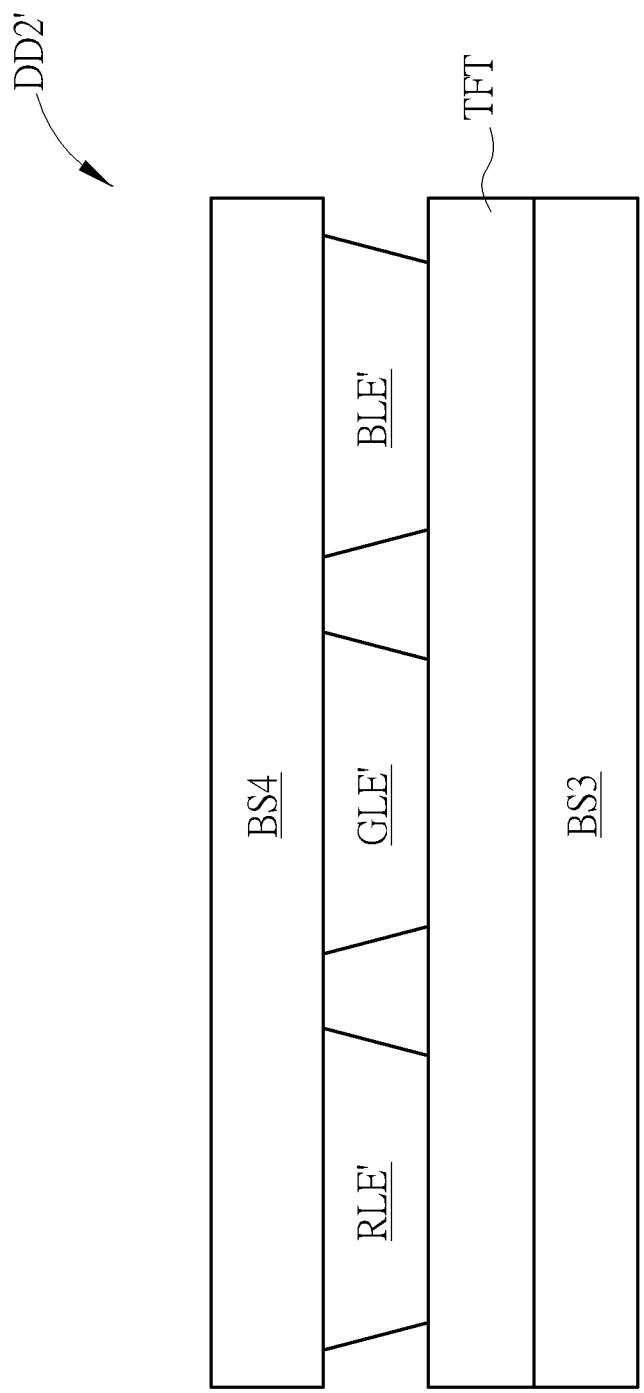
FIG. 10 schematically illustrates a cross-sectional view of a display device according to a variant embodiment of the second embodiment of the present disclosure.

Refer to FIG. 10, which schematically illustrates a cross-sectional view of a display device according to a variant embodiment of the second embodiment of the present disclosure. A difference between the display device DD2' of the variant embodiment and the display device DD2 of the second embodiment is that each light emitting element is a light emitting diode chip or a light emitting diode package. In one embodiment, the light emitting elements may include a red light emitting element RLE' for generating a red light, a green light emitting element GLE' for generating a green light and a blue light emitting element BLE' for generating a blue light. For example, the light emitting element may be a normal LED with a chip size in a range from 300 µm to 2 mm, a mini-LED with a chip size in a range from 100 µm to 300 µm, or a micro-LED with a chip size in a range from 1 µm to 100 µm, or a quantum dot light emitting diode (QLED) which includes quantum dot materials. Thus, through adjusting the maximum peak wavelength of the emission spectrum of the blue light emitting element BLE', the emission spectrum of the display device DD2' may meet the standard of the first ratio, the second ratio and the third ratio.

In another embodiment, the display device DD2' may further include at least one of the color filter layer and the light converting layer of the first embodiment disposed on the light emitting elements to adjusting its emission spectrum.

As the above mentioned, the emission spectrum of the display device of the present disclosure has the maximum peak wavelength greater than or equal to 453 nm and has the first ratio in a range from 40% to 65%, so the display device can reduce the blue light hazard to the user's eyes and also can display the white image with normal white point when being operated at the highest grey level. Accordingly, the reduction of the blue light hazard and enhancement of the display quality can be both achieved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A display device having an emission spectrum,
   wherein the emission spectrum is performed in a white image of highest grey level,
   wherein the emission spectrum comprises a first sub emission spectrum ranging from 380 nm to 478 nm and a second sub emission spectrum ranging from 479 nm to 780 nm, and the first sub emission spectrum having a maximum peak wavelength greater than or equal to 453 nm,
   wherein an integral value of the first sub emission spectrum multiplied by a blue light hazard weighting function from 380 nm to 478 nm is defined as a first integration, and an integral value of the second sub emission spectrum multiplied by an eye function from 479 nm to 780 nm is defined as a second integration,
   wherein a ratio K of the first integration to the second integration is in a range from 40% to 65%,
   wherein an equation representing calculation of the ratio K is shown as below:

$$K = \frac{\int_{380}^{478} \Phi(\lambda) B(\lambda) d\lambda}{\int_{479}^{780} \Phi(\lambda) Y(\lambda) d\lambda},$$

and
   wherein $\lambda$ is a wavelength, $\Phi(\lambda)$ is the emission spectrum, $B(\lambda)$ is the blue light hazard weighting function, and $Y(\lambda)$ is the eye function.

2. The display device as claimed in claim 1, wherein the display device comprising a backlight unit and a display panel.

3. The display device as claimed in claim 1, wherein the display device comprising a plurality of inorganic light emitting elements.

4. The display device as claimed in claim 1, wherein the display device comprising a plurality of organic light emitting elements.

5. The display device as claimed in claim 1, wherein the white image has a white point, an x value of the white point in the CIE 1931 xy chromaticity diagram is in a range from 0.29 to 0.34, a y value of the white point in the CIE 1931 xy chromaticity diagram is in a range from 0.305 to 0.355.

6. The display device as claimed in claim 1, wherein a ratio of an integral value of the emission spectrum from 415 nm to 455 nm to an integral value of the emission spectrum from 400 nm to 500 nm is less than 50%.

7. The display device as claimed in claim 1, wherein the maximum peak wavelength of the first sub emission spectrum is less than or equal to 478 nm.

8. The display device as claimed in claim 1, wherein the display device comprises a blue light emitting element for generating a blue light and a light converting layer for converting the blue light into a yellow light, and the blue light and the yellow light are mixed into a white light.

9. The display device as claimed in claim 8, wherein the first sub emission spectrum further comprises a maximum peak at the maximum peak wavelength, wherein a ratio of an intensity of a peak of the emission spectrum from 480 nm to 580 nm to an intensity of the maximum peak is in a range from 40% to 60%.

10. The display device as claimed in claim 1, wherein the display device comprises a blue light emitting element for generating a blue light and a light converting layer disposed on the blue light emitting element, the light converting layer comprises two light converting materials for respectively converting the blue light into a red light and converting the blue light into a green light, and the blue light, the red light and the green light are mixed into a white light.

11. The display device as claimed in claim 10, wherein the first sub emission spectrum further comprises a maximum peak at the maximum peak wavelength, wherein a ratio of an intensity of a peak of the emission spectrum from 480 nm to 580 nm to an intensity of the maximum peak is in a range from 45% to 70%.

12. The display device as claimed in claim 1, wherein the display device comprises a blue color filter having a transmission spectrum, the transmission spectrum has another maximum peak wavelength equal to or greater than 453 nm.

13. The display device as claimed in claim 1, wherein the display device comprises a blue light emitting element having another emission spectrum, and the another emission spectrum has another maximum peak wavelength greater than or equal to 453 nm and less than or equal to 478 nm.

14. A manufacturing method of a display device, comprising:
providing a backlight unit; and
providing a display panel disposed corresponding to the backlight unit,
wherein an emission spectrum is performed by the display device in a white image of highest grey level,
wherein the emission spectrum comprises a first sub emission spectrum ranging from 380 nm to 478 nm and a second sub emission spectrum ranging from 479 nm to 780 nm, and the first sub emission spectrum has a maximum peak wavelength greater than or equal to 453 nm,
wherein an integral value of the first sub emission spectrum multiplied by a blue light hazard weighting function from 380 nm to 478 nm is defined as a first integration, and an integral value of the second sub emission spectrum multiplied by an eye function from 479 nm to 780 nm is defined as a second integration,
wherein a ratio K of the first integration to the second integration is in a range from 40% to 65%,
wherein an equation representing calculation of the ratio K is shown as below:

$$K = \frac{\int_{380}^{478} \Phi(\lambda)B(\lambda)d\lambda}{\int_{479}^{780} \Phi(\lambda)Y(\lambda)d\lambda},$$

and
wherein $\lambda$ is a wavelength, $\Phi(\lambda)$ is the emission spectrum, $B(\lambda)$ is the blue light hazard weighting function, and $Y(\lambda)$ is the eye function.

15. The manufacturing method of the display device as claimed in claim 14, wherein the backlight unit comprises at least one blue light emitting element for generating a blue light and a light converting layer covering the blue light emitting element, an input light is emitted from the light converting layer, the display panel comprises a color filter layer, and the color filter layer converts the input light into an output light with the emission spectrum.

16. The manufacturing method of the display device as claimed in claim 14, wherein the light converting layer comprises a light converting material for converting the blue light into a yellow light.

17. The manufacturing method of the display device as claimed in claim 14, wherein the light converting layer comprises two light converting materials for respectively converting the blue light into a red light and converting the blue light into a green light.

18. The manufacturing method of the display device as claimed in claim 14, wherein the display panel comprises a blue color filter having a transmission spectrum, and the transmission spectrum has another maximum peak wavelength greater than 453 nm.

19. A manufacturing method of a display device, comprising:
providing a base; and
forming a plurality of light emitting elements on the base,
wherein an emission spectrum is performed by the display device in a white image of highest grey level,
wherein the emission spectrum comprises a first sub emission spectrum ranging from 380 nm to 478 nm and a second sub emission spectrum ranging from 479 nm to 780 nm, and the first sub emission spectrum has a maximum peak wavelength greater than or equal to 453 nm,
wherein an integral value of the first sub emission spectrum multiplied by a blue light hazard weighting function from 380 nm to 478 nm is defined as a first integration, and an integral value of the second sub emission spectrum multiplied by an eye function from 479 nm to 780 nm is defined as a second integration,
wherein a ratio K of the first integration to the second integration is in a range from 40% to 65%,
wherein an equation representing calculation of the ratio K is shown as below:

$$K = \frac{\int_{380}^{478} \Phi(\lambda)B(\lambda)d\lambda}{\int_{479}^{780} \Phi(\lambda)Y(\lambda)d\lambda},$$

and
wherein $\lambda$ is a wavelength, $\Phi(\lambda)$ is the emission spectrum, $B(\lambda)$ is the blue light hazard weighting function, and $Y(\lambda)$ is the eye function.

20. The manufacturing method of the display device as claimed in claim 19, wherein the light emitting elements comprises a blue light emitting element for generating a blue light, a red light emitting element for generating a red light and a green light emitting element for generating a green light, and the blue light, the red light and the green light are mixed into an output light with the emission spectrum.

* * * * *